United States Patent [19]

Ashworth

[11] Patent Number: 4,718,098

[45] Date of Patent: Jan. 5, 1988

[54] MULTI-DIAPHRAGM ARTIFICIAL REVERBERATION DEVICE

[76] Inventor: William J. Ashworth, 1012 W. Lake Brantley, Altamonte Springs, Fla. 32714

[21] Appl. No.: 888,125

[22] Filed: Jul. 22, 1986

[51] Int. Cl.[4] .................... H03G 3/00

[52] U.S. Cl. .................... 381/64; 381/159; 181/160

[58] Field of Search .................... 381/96, 88, 89, 90, 381/64, 159; 179/181 W; 181/160

[56] References Cited

U.S. PATENT DOCUMENTS

| | | | |
|---|---|---|---|
| 2,768,235 | 10/1956 | Knoblaugh . | |
| 2,835,145 | 9/1958 | Martin . | |
| 2,923,369 | 2/1960 | Kuhl . | |
| 3,217,829 | 11/1965 | Faulkner | 181/160 |
| 3,449,531 | 6/1969 | Ashworth . | |
| 3,509,282 | 4/1970 | Ashworth . | |
| 3,941,932 | 3/1976 | D'Hoogh | 381/96 |
| 4,064,365 | 12/1977 | Zeller | 381/159 |
| 4,138,594 | 2/1979 | Klipsch | 381/90 |
| 4,151,379 | 4/1979 | Ashworth . | |
| 4,509,184 | 4/1985 | Yanagawa | 381/90 |

OTHER PUBLICATIONS

Popular Mechanics, Jul. 1982, p. 58 and p. 132.

*Primary Examiner*—Forester W. Isen

[57] ABSTRACT

An electro-mechanico-acoustic structure in which magnetic wave energy is converted directly into acoustic energy and partly stored and then converted into audiible acoustic energy in a gradual manner over a period of time.

2 Claims, 5 Drawing Figures

MULTI-DIAPHRAGM ARTIFICIAL REVERBERATION DEVICE

BACKGROUND OF INVENTION

Numerous systems and devices have hitherto been proposed for accomplishing results which I attain by my invention that have been both complex and expensive and in many cases impractical for the uses to which I put my invention. The present development provides a reverberation means which is simple in construction and can easily be produced by mass production methods, and at relatively low cost.

SUMMARY OF INVENTION

My invention relates generally to synthesizing reverberant sound effects such as are present in large rooms or auditoriums, the boundaries of which reflect at least a portion of the sound energy which strikes them either directly to indirectly from the original source of the sound. The invention has to do with means which may be employed with electrical musical instruments, sound amplifying systems, radios, television sets, and the like wherein it may be desired to introduce reverberation effects.

The object of my invention is to provide a small compact reverberation device which occupies little space. It is a still further object of the present invention to provide a simple, direct method of simulating the sound conditions in large rooms having walls which reflect at least a portion of the sound energy present in the room. It is a specific object of my invention to provide a method and an electro-mechanico-acoustic structure in which electric oscillations are converted into mechanical vibratory energy and thence into audible acoustic energy, in which the magnetic energy is converted into acoustic energy, and partly stored and thence converted into audible acoustic energy in a gradual manner.

Other objects will be set forth hereafter or will be apparent to one skilled in the art upon reading these specifications. The constructions and arrangements and parts of which I shall describe certain exemplary embodiments, reference being had to the accompanying drawing. It will be obvious however, that the utility of my invention will be limited neither to the embodiments herein described nor to the particular usage which are described herein.

DESCRIPTION OF THE PREFERRED EMBODIMENTS

Figure 1:
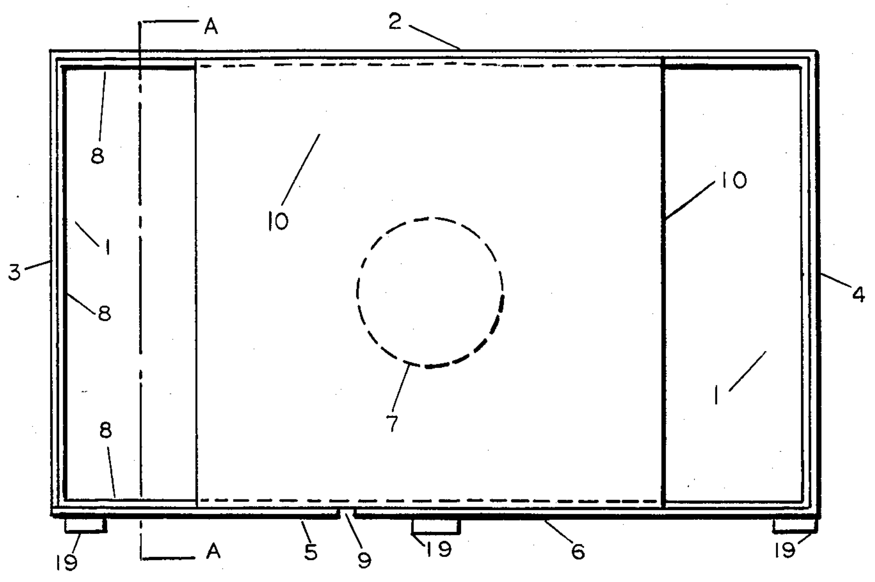
FIG. 1 is a front elevation of an embodiment of my invention.
Figure 2:
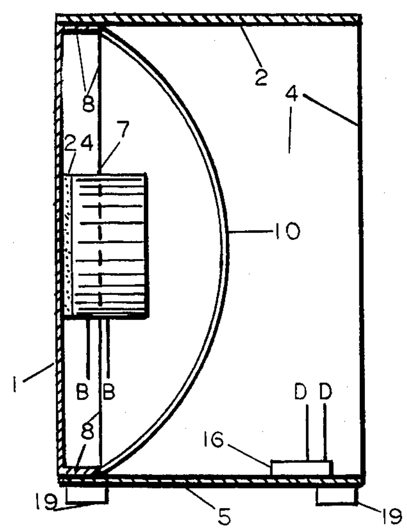
FIG. 2 is a sectional view taken on the plane A—A of the device in FIG. 1.

FIG. 1 is an open mouthed box having members consisting of back 1, top 2, sides 3 and 4, and bottoms 5 and 6. An electro-magnet 7 is attached to back 1. The embodiment of the invention shown in FIG. 1 is constructed of a thin magnetizable steel with a lip 8 formed around the edge of back 1. Top 2, sides 3 and 4, and bottoms 5 and 6 may be formed from a strip of thin magnetizable steel. The top sides and bottoms are firmly secured to lip 8 by a suitable fastening means such as welding or a suitable adhesive such as an epoxy resin. Electro-magnet 7 is attached to back 1 with a pliable spacer 24 interposed between electro-magnet 7 and back 1 by a suitable means such as contact cement. Electro-magnet 7 will not be described because such electro-magnet transducers are well known to those skilled in the art and two such devices are described in my U.S. Pat. Nos. 3,449,531 and 4,151,379. When the electro-magnet 7 is electrically activated with an oscillatory signal, back 1 acts as an audio transducer armature and vibrates, emitting sound without additional amplification. The vibrations are transferred to top 2, sides 3 and 4 and bottoms 5 and 6. The foward edges of top 2, sides 3 and 4 and bottoms 5 and 6 are substantially undamped and are free to continue to vibrate when activated by vibrations, thereby storing the vibratory energy and releasing it over a period of time as audible sound. The members 1,2,3,4,5, and 6 are sound radiating elements when vibratorily activated and are tuned to different resonant frequencies. The different tuned resonant frequencies of the sound radiating diaphragm causes this invention to store the vibrations over a broad frequency range to be gradually released over a period of time.

Figure 3:
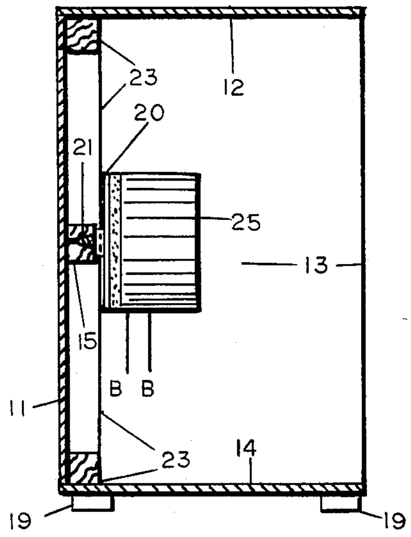
FIG. 3 is a sectional view of the invention showing alternate construction methods.
Figure 4:
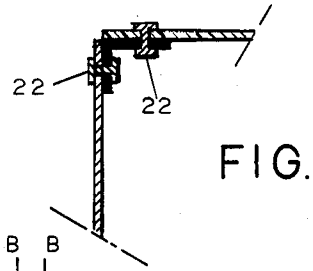
FIG. 4 is a sectional view showing another alternate construction method of the invention.
Figure 5:
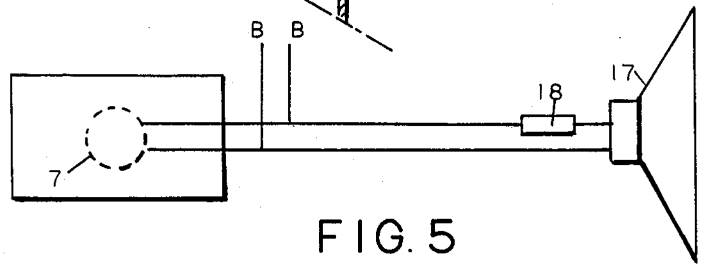
FIG. 5 is a schematic drawing showing a method of use of the invention.

This invention may be constructed from 24 gauge cold rolled steel and may be approximately 10 inches long, 6 inches deep and 6 inches high. This size produces a very pleasant echo effect but the reverberation delay time may be increased by enlarging the structure and by varying the thickness of the material. Bottoms 5 and 6 may be solid or be separated by gap 9. The advantage of this separation is that the bottoms 5 and 6 may be tuned to different resonant frequencies and have a longer undamped edge that allows them to have a longer reverberation time. Gap 9 may be varied in width. Gaps may also be placed at other desired locations on the other sound radiating members 1,2,3,4 to obtain different reverberation time periods. Electro-magnet 7 is magnetically coupled to back 1. The electro-magnet 7 directly transfers its magnetic wave energy to back 1, causing the sound structure shown in FIG. 1 to become a magnetically activated armature and the primary sound reproducing vibratory element of the audio transducer 7. The vibrations impressed on back 1 are transferred to top 2, sides 3 and 4 and bottoms 5 and 6, which sustain the vibration and gradually release the vibrations as audible sound. Member 10 is an optical screen used to conceal electro-magnet 7 from view and may be constructed from any suitable material. It may be fastened to lips 8 or near the rearward edges so as not to attach to any portion of the primary sound radiating elements which would substantially dampen the vibratory storing ability of the sound radiating elements. An audio transducer 25 as shown in FIG. 3 may be attached to back 1 rather than the electro-magnet alone. This invention may be constructed from materials that are metal in whole or in part. Cushion pads 19 may be fastened to the bottom of the invention to cushion it when placed on another object such as a table. FIG. 3 shows the invention constructed of thin wood such as plywood. To obtain the reverberatory effect given by metal, the structure constructed from wood will be required to be much larger. Back 1 may be constructed of metal or wood or other material and top 12, sides 13, and bottom 14 from metal or wood or in combination with each other. An audio transducer 25 may be attached to back 11 by any suitable means or as shown by screwing it into wood block 15 with screw 21 attached to magnetizable plate 20. Wood block 15 is attached to back 11 with glue or any other suitable means. Audio transducers are well known to those skilled in the art and are described in my U.S. Pat. Nos. 3,449,531 and 4,151,379. FIG. 4 shows a different method of connecting the sound radiating elements together. Rivets 22 may be used or screws and nuts. All connections must be tight or a rattle will be audible when the invention is in operation. Electro-magnet 7 or audio transducer 25 may be attached to any sound radiating member of the sound structure but best results will be usually obtained by attaching the transducer to the back 1 or 11. FIG. 5 shows the preferred method of use of the invention together with a primary sound radiating source. The purpose of the invention is to add reverberation to the primary sound. The invention is not intended to be the primary sound source but only to supply the reverberation components of the sound to be blended with the primary sound source 17 such as a loudspeaker as shown in FIG. 5. The invention and the primary sound geenrator 17 will usually be electrically connected in parallel with electrical signal balancing means 18 interposed in the electrical circuit such as a fixed or variable resistor or other balancing means. Other suitable electrical connecting means may be used. This blending will approximately duplicate the actual reverberation produced by an auditorium because the sound radiating elements of the invention are unbaffled. The unbaffled sound radiators are tuned to different resonant frequencies and different vibratory energy will be dominant on the different sound radiating members. The unbaffled sound radiating diaphragms resultin cancellations and reinforcements of the primary audible sound signal and also the synthesized reverberation audible sound signals as would result in an auditorium when the generated sounds are reflected in the auditorium and blended together in the listener's ear.

A piezo electric element or microphone 16 may be attached to the sound structure to convert the vibratory energy into an electrical signal through leads D—D for use to supply other electrical amplifying means. Leads B—B to electro-magnet 7 or audio transducer 25 are connected to any device that will supply a suitable electrical signal to leads B—B.

It will be understood that details shown and described of the construction may be altered or omitted without departing from the spirit of this disclosure as defined by the following claims:

I claim:

1. An acoustic device for the production of artificial reverberation comprising a vibrational audio sound radiating structure with vibratory means for impressing mechanical vibrations on said sound radiating structure with said sound radiating structure being constructed of a thin material that will easily vibrate, with said sound radiating structure consisting of a back, top, side, and bottom members, whereby said back member is firmly attached to the rearward areas of other said members with said top, side, and bottom members being firmly connected together where they join one another with said back, top, side, and bottom members forming a multi-diaphragm sound radiating device with the forward portions of said top, side, and bottom members being open ended and substantially undamped where a portion of said mechanical vibrations impressed on said radiating structure is sustained by said sound radiating structure with said sustained vibrations being discharged gradually as audible sound when said sound structure is set in motion by said vibratory means, and wherein said sound radiating structure is constructed from a magnetizable material and is vibrated magnetically by electro-magnetic means, whereby the magnetic energy produced by said electro-magnetic means is imposed directly on said magnetizable sound radiating structure, causing said sound radiating structure to vibrate and produce audible sound.

2. An acoustic device for the production of artificial reverberation comprising a vibrational audio sound radiating structure with vibratory means for impressing mechanical vibrations on said sound radiating structure with said sound radiating structure being constructed of a thin material that will easily vibrate, with said sound radiating structure consisting of a back, top, side, and bottom members, whereby said back member is firmly attached to the rearward areas of other said members with said top, side, and bottom members being firmly connected together where they join one another with said back, top, side, and bottom members forming a multi-diaphragm sound radiating device with the forward portions of said top, side, and bottom members being open ended and substantially undamped where a portion of said mechanical vibrations impressed on said radiating structure is sustained by said sound radiating structure with said sustained vibrations being discharged gradually as audible sound when said sound structure is set in motion by said vibratory means, and wherein said sound radiating structure is constructed from a magnetizable material and is vibrated magnetically by electro-magnetic means, whereby the magnetic energy produced by said electro-magnetic means is imposed directly on said magnetizable sound radiating structure, causing said sound radiating structure to vibrate and produce audible sound, and further wherein, said sound radiating structure is operated together with a conventional cone type loudspeaker and said sound radiating structure are simultaneously activated by electrical means and the audible sound produced by said conventional loudspeaker and the audible delayed sound produced by said sound radiating device are blended together in the same listening space.

* * * * *